(12) United States Patent
Togawa et al.

(10) Patent No.: US 6,409,582 B1
(45) Date of Patent: Jun. 25, 2002

(54) POLISHING APPARATUS (75) Inventors: Tetsuji Togawa, Chigasaki; Kuniaki Yamaguchi, Yokohama; Shunichiro Kojima, Fujisawa; Toyomi Nishi, Yokohama, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/531,589

(22) Filed: Mar. 20, 2000

Related U.S. Application Data (63) Continuation of application No. 08/807,810, filed on Feb. 26, 1997, now Pat. No. 6,050,884.

(30) Foreign Application Priority Data

Feb. 28, 1996 (JP) ................................. 8-69259
Mar. 19, 1996 (JP) ................................. 8-90567

(51) Int. Cl.⁷ ................................. B24B 7/22
(52) U.S. Cl. ........................... 451/67; 451/41
(58) Field of Search .................. 451/41, 287, 288, 451/66, 54, 67, 444, 443, 73, 56

(56) References Cited

U.S. PATENT DOCUMENTS

| | | |
|---|---|---|
| 4,193,226 A | 3/1980 | Gill, Jr. et al. |
| 4,481,738 A | 11/1984 | Tabuchi |
| 4,680,893 A | 7/1987 | Cronkhite et al. |
| 4,944,119 A | 7/1990 | Gill, Jr. et al. |
| 5,545,076 A | 8/1996 | Yun et al. |
| 5,616,063 A | 4/1997 | Okumura et al. |
| 5,655,954 A * | 8/1997 | Oishi et al. ................. 451/67 |
| 5,670,011 A | 9/1997 | Togawa et al. |
| 5,738,574 A * | 4/1998 | Tolles et al. ................ 451/288 |
| 5,839,947 A | 11/1998 | Kimura et al. |

FOREIGN PATENT DOCUMENTS

| | | | |
|---|---|---|---|
| EP | 648-575 A1 | 4/1995 | |
| JP | 61-170569 | 8/1986 | |
| JP | 62-224563 | * 10/1987 | ............. 451/288 |
| JP | 4-334025 | 11/1992 | |
| JP | 7-299734 | 11/1995 | |
| JP | 8-153693 | 6/1996 | |

* cited by examiner

Primary Examiner—Robert A. Rose
(74) Attorney, Agent, or Firm—Wenderoth, Lind & Ponack, L.L.P.

(57) ABSTRACT

A polishing apparatus is used for polishing a workpiece such as a semiconductor wafer to a flat mirror finish. The polishing apparatus, includes a turntable having a polishing surface thereon, and a top ring for holding a workpiece to be polished and pressing the workpiece against the polishing surface on the turntable. A pusher is disposed in a position for transferring the workpiece to and from the top ring, and has a workpiece support which can be lifted to a position close to the top ring for transferring the workpiece to and from the top ring. When the workpiece support receives a polished workpiece and is lowered, a cleaning liquid is ejected substantially simultaneously from three cleaning nozzle units that are disposed in respective three positions to clean the upper and lower surfaces of the workpiece and the lower surface of the top ring.

6 Claims, 13 Drawing Sheets

POLISHING APPARATUS

This is a continuation of U.S. patent application Ser. No. 08/807,810, filed Feb. 26, 1997 now U.S. Pat. No. 6,050,884.

BACKGROUND OF THE INVENTION

1. Field of the Invention

The present invention relates to a polishing apparatus for polishing a workpiece such as a semiconductor wafer to a flat mirror finish, and more particularly to a polishing apparatus having a cleaning device for cleaning a top ring for supporting a workpiece and/or the workpiece which has been polished.

2. Description of the Related Art

Recent rapid progress in semiconductor device integration demands smaller and smaller wiring patterns or interconnections and also narrower spaces between interconnections which connect active areas. One of the processes available for forming such interconnection is photolithography. Though the photolithographic process can form interconnections that are at most 0.5 μm wide, it requires that surfaces on which pattern images are to be focused by a stepper be as flat as possible because the depth of focus of the optical system is relatively small.

It is therefore necessary to make the surfaces of semiconductor wafers flat for photolithography. One customary way of flattening the surfaces of semiconductor wafers is to polish them with a polishing apparatus, and such a process is called Chemical Mechanical polishing.

Conventionally, a polishing apparatus has a turntable and a top ring which rotate at respective individual speeds. A polishing cloth is attached to the upper surface of the turntable. A semiconductor wafer to be polished is placed on the polishing cloth and clamped between the top ring and the turntable. An abrasive liquid containing abrasive grains is supplied onto the polishing cloth and retained on the polishing cloth. During operation, the top ring exerts a certain pressure on the turntable, and the surface of the semiconductor wafer held against the polishing cloth is therefore polished by a combination of chemical polishing and mechanical polishing to a flat mirror finish while the top ring and the turntable are rotated.

After, for example, one or more semiconductor wafers have been polished, the polishing cloth is processed to recover its original polishing capability. Various processes have been and are being developed for restoring the polishing cloth, and are collectively called "dressing". The polishing cloth is dressed by a dressing tool in order to enable the polishing apparatus to perform a good polishing function at all times without undesired degradation of polishing performance.

The semiconductor wafer which has been polished carries abrasive liquid and ground-off particles attached thereto. After a semiconductor wafer has been polished, ground-off particles and the abrasive liquid are also attached to the top ring because the semiconductor wafer has been held by the top ring. Therefore, the polished semiconductor wafer and the top ring have to be cleaned to remove the foreign matter including abrasive liquid and ground-off particles therefrom.

It has been customary to install a robot to transfer a semiconductor wafer therefrom to the top ring before it is polished, and to transfer the semiconductor wafer from the top ring thereto after it is polished. That is, the semiconductor wafer is transferred directly between the top ring and the hand of the robot which is associated with the polishing apparatus.

Consequently, the top ring which has been used for polishing the semiconductor wafer, and the semiconductor wafer which has been polished are cleaned as follows:

(1) First, the polished surface of the semiconductor wafer which is held by the top ring is cleaned by a cleaning liquid ejected from a cleaning nozzle.

(2) Then, the semiconductor wafer is transferred from the top ring to the hand of the robot.

(3) The lower surface (holding surface) of the top ring which has held the semiconductor wafer is cleaned by a cleaning liquid ejected from the cleaning nozzle.

(4) Finally, a next semiconductor wafer to be polished is transferred from the hand of the robot to the top ring.

However, since the above conventional cleaning process involves the two cleaning steps (1) and (3), it takes a relatively long period of time to clean the semiconductor wafer and the top ring. As a consequence, the conventional polishing apparatus cannot polish the semiconductor wafers with increased efficiency.

Further, in the step (3) of the above steps, since the lower surface of the top ring is not cleaned immediately after the semiconductor wafer is polished, the abrasive liquid applied to the lower surface of the top ring tends to solidify. The cleaning liquid and ground-off particles are scattered over the polishing cloth, thus tending to alter the composition of the abrasive liquid for polishing a workpiece, with the result that the polishing performance of the polishing apparatus is varied. Bristles of a brush are liable to drop onto the polishing cloth, thus damaging a semiconductor wafer which is being polished by the polishing cloth.

Furthermore, the dressing tool suffers similar problems because it is not cleaned immediately after it has dressed the polishing cloth.

SUMMARY OF THE INVENTION

It is therefore an object of the present invention to provide a polishing apparatus which can efficiently clean a top ring and a workpiece such as a semiconductor wafer which has been polished for thereby increasing the productivity thereof.

Another object of the present invention is to provide a polishing apparatus which has a relatively simple cleaning device capable of effectively cleaning the lower surface of a top ring and/or a dressing tool without changing the composition of an abrasive liquid on a polishing cloth and also without scattering a large amount of cleaning liquid.

Still another object of the present invention is to provide a polishing apparatus which has a cleaning device capable of cleaning a hand of a robot for transferring a workpiece to be cleaned therefrom to a top ring and transferring the workpiece from the top ring thereto, and also cleaning such a workpiece.

According to one aspect of the present invention, there is provided a polishing apparatus for polishing a surface of a workpiece, comprising: a turntable having a polishing surface thereon; a top ring for holding a workpiece to be polished and pressing the workpiece against the polishing surface on the turntable; a pusher for transferring the workpiece between the top ring and the pusher, the pusher having a workpiece support movable vertically to a position close to the top ring for transferring the workpiece; and a cleaning device for ejecting a cleaning liquid toward upper and lower surfaces of the workpiece and the lower surface of the top ring to clean them, after the workpiece which has been polished is transferred from the top ring to the workpiece support.

According to another aspect of the present invention, there is provided a polishing apparatus a surface of a workpiece, comprising: a turntable having a polishing surface thereon; a top ring for holding a workpiece to be polished and pressing the workpiece against the polishing surface on the turntable; a top ring moving mechanism for lifting the top ring by a predetermined distance from the turntable and angularly moving the top ring to a predetermined position; and a top ring cleaning device having a cleaning liquid nozzle movable below the top ring for ejecting a cleaning liquid to the lower surface of the top ring to clean the lower surface of the top ring when the top ring is in the predetermined position.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENT

A polishing apparatus according to a first embodiment of the present invention will be described below with reference to FIGS. 1 through 7A and 7B.

Figure 1:
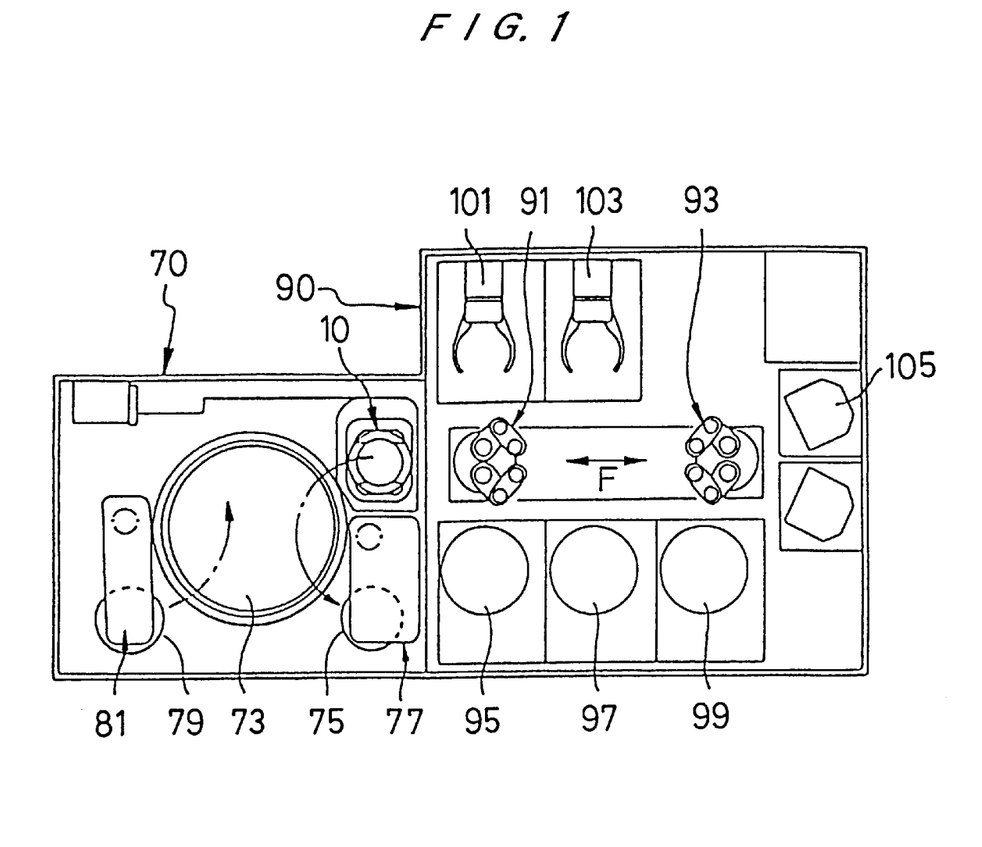
FIG. 1 is a plan view of a polishing apparatus having a conveying and cleaning apparatus according to a first embodiment of the present invention.

As shown in FIG. 1, a polishing apparatus 70 comprises a turntable 73, a polishing unit 77 positioned on one side of the turntable 73 and having a top ring 75, and a dressing unit 81 positioned on the other side of the turntable 73 and having a dressing tool 79. The polishing apparatus 70 has a pusher 10 with a cleaning device disposed adjacent to the polishing unit 77 and the turntable 73.

The polishing apparatus 70 further comprises a conveying and cleaning unit 90 which is disposed next to the polishing unit 77 and the pusher 10. The conveying and cleaning unit 90 comprises two central workpiece conveying robots 91 and 93 movable in the directions indicated by the arrow F, primary and secondary cleaning devices 95 and 97, and a spinning drier 99 which are disposed on one side of the workpiece conveying robots 91 and 93. The conveying and cleaning unit 90 further comprises two workpiece reversing units 101 and 103 disposed on the other side of the workpiece conveying robots 91 and 93.

Figure 2:
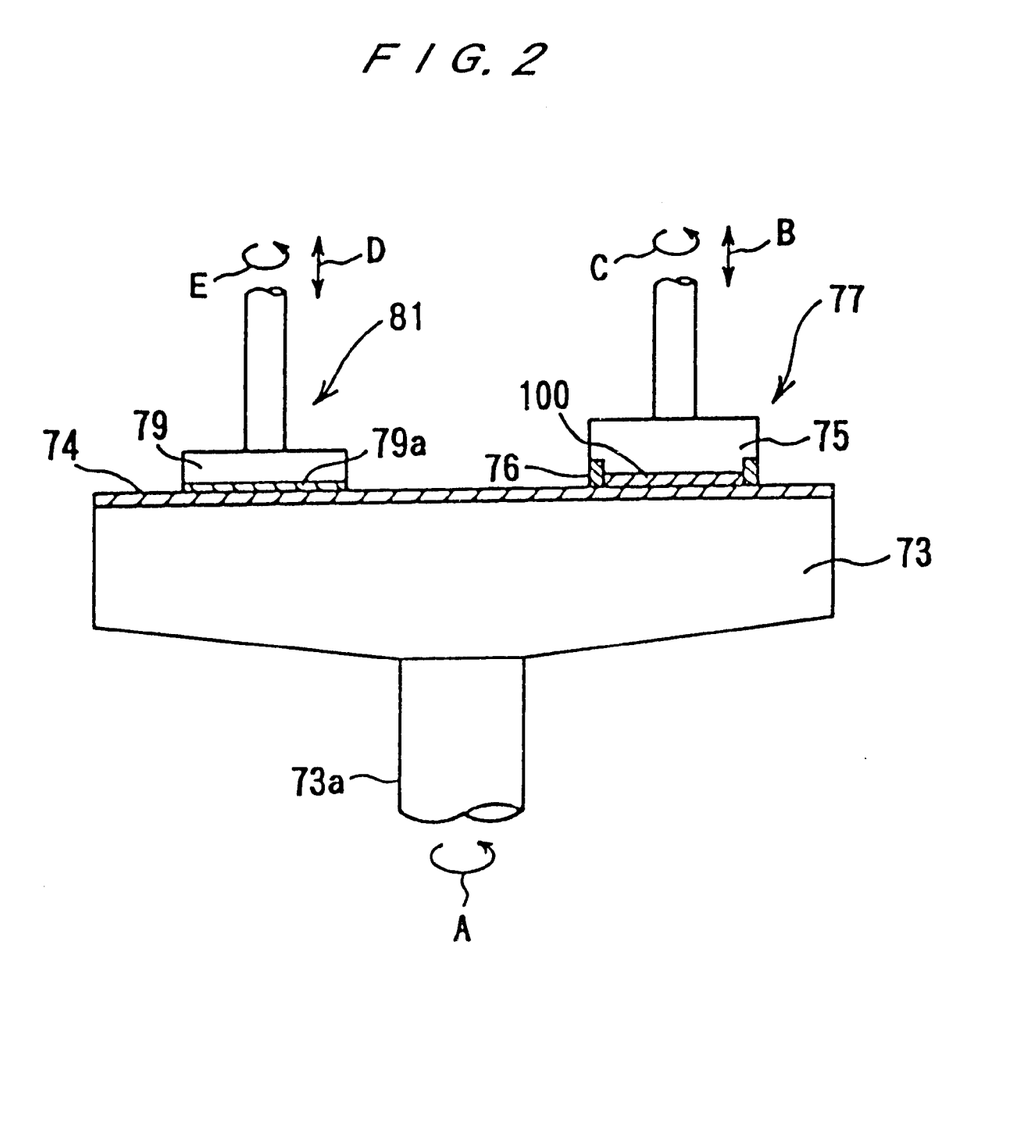
FIG. 2 is a vertical cross-sectional view of a polishing apparatus showing a polishing unit and a dressing unit shown in FIG. 1.

FIG. 2 shows the polishing unit 77 having the top ring 75 and the dressing unit 81 having the dressing tool 79. As shown in FIG. 2, the top ring 75 is located in an off-center position with respect to the turntable 73. The turntable 73 is rotatable about its own axis as indicated by the arrow A by a motor (not shown) which is coupled through a shaft 73a to the turntable 73. A polishing cloth 74 is attached to an upper surface of the turntable 73.

The top ring 75 is coupled to a motor (not shown) and also to a lifting/lowering cylinder (not shown). The top ring 75 is vertically movable and rotatable about its own axis as indicated by the arrows B, C by the motor and the lifting/lowering cylinder. The top ring 75 can therefore press a semiconductor wafer 100 against the polishing cloth 74 under a desired pressure. The semiconductor wafer 100 is attached to a lower surface of the top ring 75 under a vacuum or the like. A guide ring 76 is mounted on the outer circumferential edge of the lower surface of the top ring 75 for preventing the semiconductor wafer 100 from being disengaged from the top ring 75.

Dressing unit 81 comprises dressing tool 79 which is positioned above the turntable 73 in diametrically opposite relation to the top ring 75. The dressing tool 79 is coupled to a motor (not shown) and also to a lifting/lowering cylinder (not shown). The dressing tool 79 is vertically movable and rotatable about its own axis as indicated by the arrows D, E by the motor and the lifting/lowering cylinder. The dressing tool 79 has a dressing layer 79a composed of, for example, a diamond grain layer containing diamond grains on its lower surface.

When a wafer cassette 105 which houses a plurality of semiconductor wafers to be polished is set in a position shown in FIG. 1, the workpiece conveying robot 93 takes out a semiconductor wafer from the cassette 105, and transfers the semiconductor wafer to the workpiece reversing unit 103. After the semiconductor wafer is reversed, i.e., turned upside down, by the workpiece reversing unit 103, it is received by the workpiece conveying robot 91, and then placed onto the pusher 10 by the workpiece conveying robot 91.

Thereafter, the top ring 75 of the polishing unit 77 is angularly displaced as indicated by the dot-and-dash line to a position directly above the pusher 10. The semiconductor wafer on the pusher 10 is lifted to a position near a lower surface of the top ring 75, and then attached to the top ring 75 under vacuum developed by a vacuum pump or the like (not shown).

Then, the top ring 75 is moved over the turntable 73, and presses the semiconductor wafer against the polishing cloth 74 on the turntable 73. While the turntable 73 and the top ring 75 are rotated independently of each other, the lower surface of the semiconductor wafer is polished to a flat mirror finish. After the semiconductor wafer is polished, the top ring 75 is moved back over the pusher 10, and transfers the polished semiconductor wafer onto the pusher 10. At this time, the upper and lower surfaces of the semiconductor wafer and the lower surface of the top ring 75 are cleaned by the cleaning device according to the present invention.

The semiconductor wafer placed on the pusher 10 is then held by the workpiece conveying robot 91, and transferred therefrom to the workpiece reversing unit 101. The workpiece reversing unit 101 reverses the semiconductor wafer. The reversed semiconductor wafer is transferred successively to the primary and secondary cleaning devices 95 and 97, and the spinning drier 99, whereby it is cleaned and dried. The spinning drier 99 may have a function of cleaning and drying. The cleaned and dried-semiconductor wafer is finally returned to the cassette 105 by the workpiece conveying robot 93.

Figure 3:
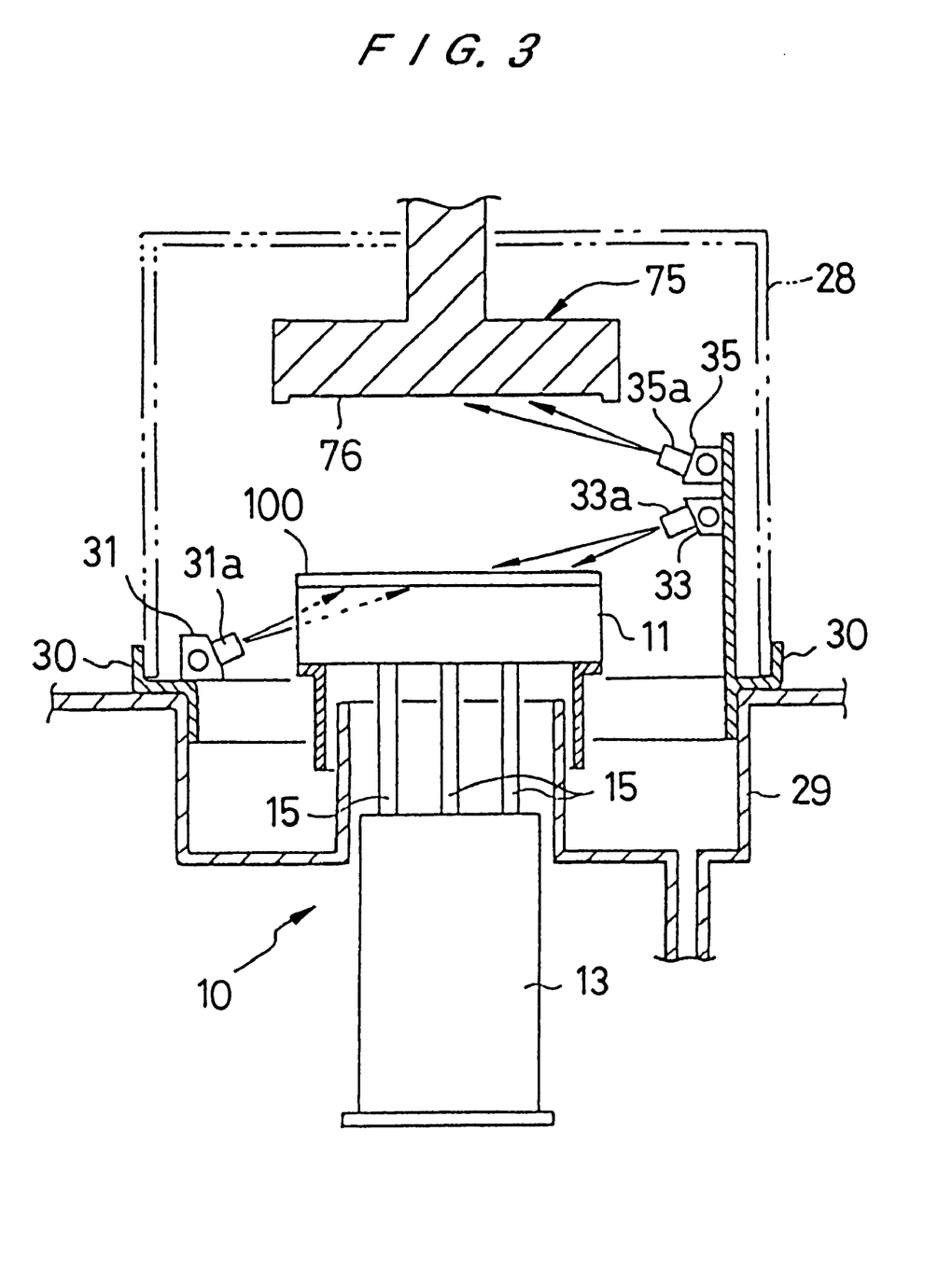
FIG. 3 is a vertical cross-sectional view of a pusher and a top ring which are combined with a cleaning device according to the first embodiment of the present invention.

FIG. 3 shows, in vertical cross section, the pusher 10 and the top ring 75, which are combined with the cleaning device according to the present invention.

As shown in FIG. 3, the pusher 10 comprises a workpiece support 11 for placing a semiconductor wafer 100 thereon and an actuator unit 13 for vertically moving the workpiece support 11. The workpiece support 11 is supported on the upper ends of vertical rods 15 that vertically movably project from the actuator unit 13. In FIG. 3, the semiconductor wafer 100 is shown as being placed on the workpiece support 11, and the workpiece support 11 is shown as being lowered.

Figure 4:
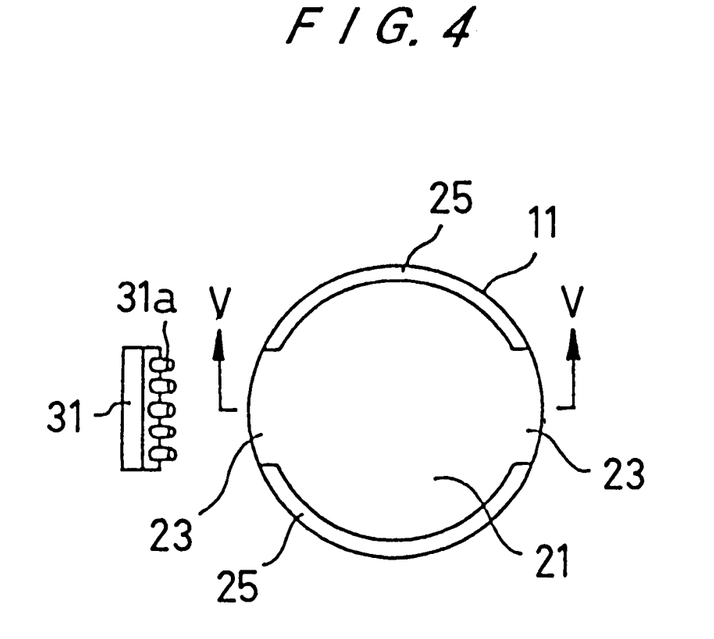
FIG. 4 is a plan view of a workpiece support of the pusher shown in FIG. 3.
Figure 5:
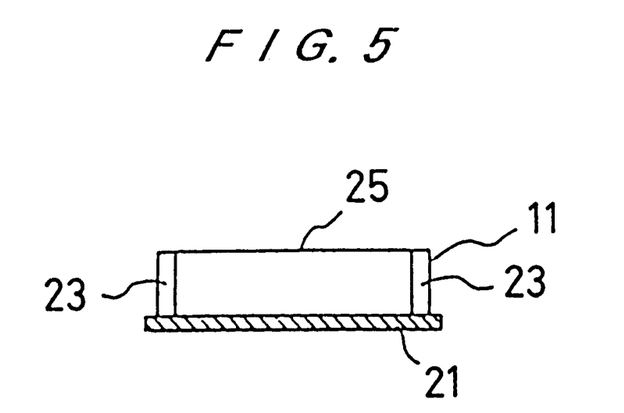
FIG. 5 is a cross-sectional view taken along line V—V of FIG. 4.

As shown in FIGS. 3 through 5, the workpiece support 11 has a circular base 21, and a pair of arcuate walls forming wafer holders 25 mounted on an outer circumferential edge of the circular base 21 and spaced from each other by a pair of recesses 23 defined therebetween. The recesses 23 serve to receive the hand of the workpiece conveying robot 91 for transferring the semiconductor wafer 100 therefrom to the arcuate walls 25 and transferring the semiconductor wafer 100 from the arcuate walls 25 thereto.

The workpiece support 11 also has a guide mechanism (not shown) combined with the wafer holders 25 for guiding and positioning the semiconductor wafer 100 when the semiconductor wafer 100 is placed on the wafer holders 25.

In FIG. 3, the polishing apparatus has a polisher pan 30 provided around the pusher 10 and supporting three cleaning nozzle units 31, 33 and 35 thereon, a cover 28 mounted on the polisher pan 30 and covering the workpiece support 11 and the top ring 75, and a pusher pan 29 disposed underneath the polisher pan 30 and underlying the workpiece support 11. The cover 28 serves to prevent a cleaning liquid ejected from the cleaning nozzle units 31, 33 and 35 from being scattered around, and the pusher pan 29 serves to collect the cleaning liquid flowing down from the top ring 75 and the workpiece support 11.

The cleaning nozzle unit 31 is positioned laterally of a location where the workpiece support 11 is lowered. As shown in FIG. 4, the cleaning nozzle unit 31 has a horizontal array of five nozzles 31a directed to eject the cleaning liquid obliquely upwardly into one of the recesses 23.

The cleaning nozzle unit 33 is positioned laterally of a location vertically intermediate between the workpiece support 11 when it is lowered and the top ring 75. Specifically, the cleaning nozzle unit 33 is disposed substantially diametrically opposite to the cleaning nozzle unit 31 across the workpiece support 11. The cleaning nozzle unit 33 has a horizontal array of four nozzles 33a directed to eject the cleaning liquid obliquely downwardly toward the workpiece support 11.

The cleaning nozzle unit 35 is positioned directly above the cleaning nozzle unit 33. The cleaning nozzle unit 35 has a horizontal array of two nozzles 35a directed to eject the cleaning liquid obliquely upwardly onto the lower surface (holding surface) 76 of the top ring 75.

Figure 6:
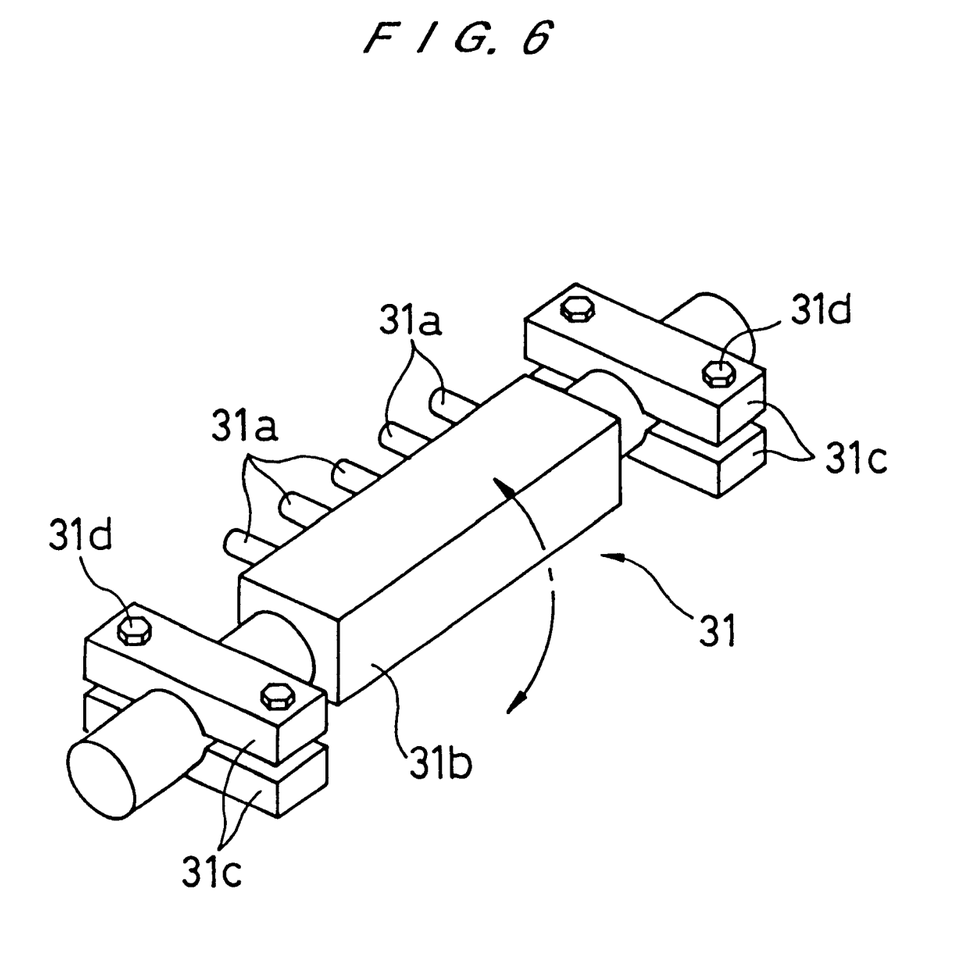
FIG. 6 is a perspective view of a cleaning nozzle unit of the cleaning device shown in FIG. 3.

As shown in FIG. 6, the cleaning nozzle unit 31 has a nozzle header 31b on which the nozzles 31a are mounted. The nozzle header 31b has opposite ends each fastened by two bars 31c that are fastened by bolts 31d. When the bolts 31d are loosened, the nozzle header 31b can be angularly moved about its own axis to adjust the angle of the nozzles 31a. After the angle of the nozzles 31a is adjusted, the bolts 31d are tightened to fix the nozzle header 31b against angular movement. The other cleaning nozzle units 33 and 35 are of a structure similar to the cleaning nozzle unit 31.

Operation of the cleaning device and the pusher 10 will be described below.

Figure 7A:
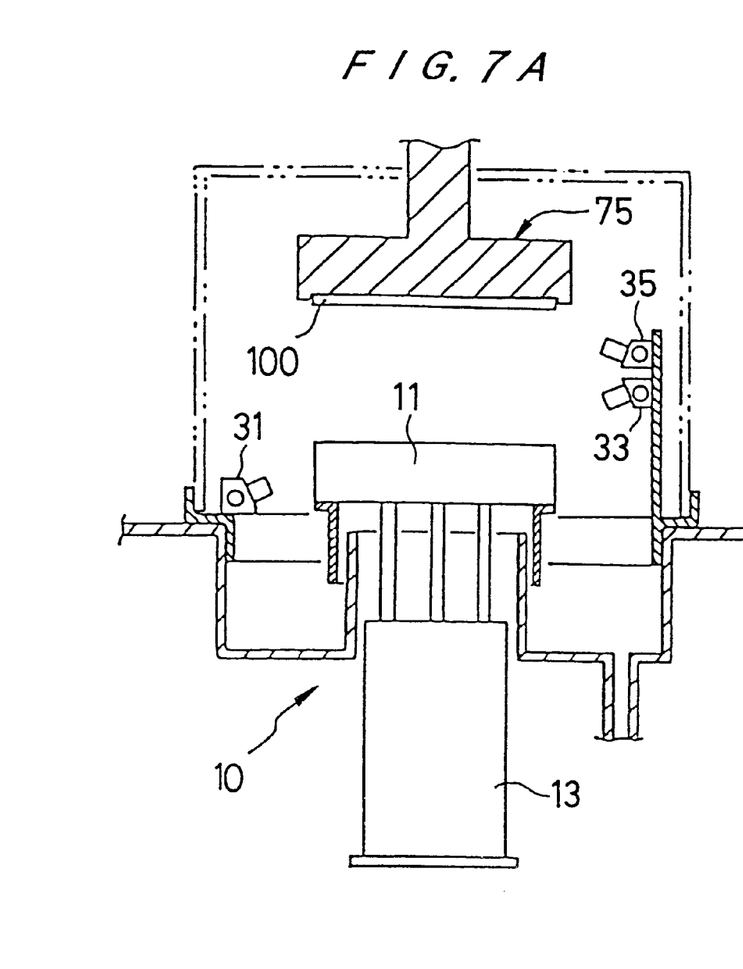
FIGS. 7A and 7B are vertical cross-sectional views showing the manner in which a semiconductor wafer which has been polished is transferred from the top ring to the pusher.
Figure 7B:
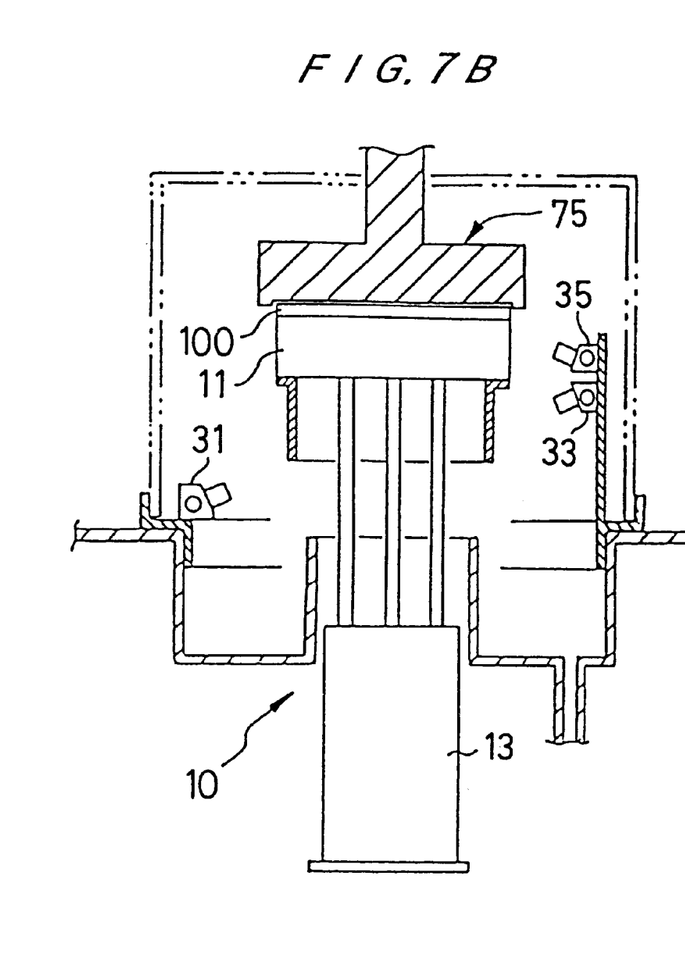

FIGS. 7A and 7B show the manner in which the semiconductor wafer 100 which has been polished is transferred from the top ring 75 to the pusher 10. Specifically, the top ring 75 holding the polished semiconductor wafer 100 under vacuum is moved to a position directly above the pusher 10 as shown in FIG. 7A. Then, the actuator unit 13 of the pusher 10 is operated to lift the workpiece support 11 toward the top ring 75 as shown in FIG. 7B. Thereafter, the semiconductor wafer 100 is released from the top ring 75 by breaking vacuum onto the workpiece support 11.

The actuator unit 13 is operated again to lower the workpiece support 11 away from the top ring 75 as shown in FIG. 3. Then, the three cleaning nozzle units 31, 33 and 35 are simultaneously operated to eject the cleaning liquid such as pure water, from their nozzles 31a, 33a and 35a for thereby cleaning the upper and lower surfaces of the semiconductor wafer 100 and the lower surface 76 of the top ring 75.

Specifically, the cleaning liquid ejected from the cleaning nozzle unit 31 enters one of the recesses 23 of the workpiece support 11 and cleans the lower surface, which has been polished, of the semiconductor wafer 100. The cleaning liquid ejected from the cleaning nozzle unit 33 is directly applied to the upper surface of the semiconductor wafer 100 to thus clean it. The cleaning liquid ejected from the cleaning nozzle unit 35 is directly applied to the lower surface 76, which has held the semiconductor wafer 100, of the top ring 75 to thus clean it. Therefore, the abrasive liquid and ground-off particles which remain on the upper and lower surfaces of the semiconductor wafer 100 and the lower surface 76 of the top ring 75 are completely removed. At this time, the workpiece support 11 is also cleaned by the cleaning liquid.

The cleaning liquid starts being ejected simultaneously from the cleaning nozzle units 31, 33 and 35. The cleaning nozzle units 31 and 33 eject the cleaning liquid continuously for 13 seconds, and the cleaning nozzle unit 35 ejects the cleaning liquid for 10 seconds. Since the cleaning of the semiconductor wafer 100 is continued for some time after the top ring 75 has been cleaned, any deposit which may have dropped from the top ring 75 onto the semiconductor wafer 100 is reliably removed from the semiconductor wafer 100.

However, the cleaning liquid may start being ejected at different times from the cleaning nozzle units 31, 33 and 35, and may continuously be ejected from the cleaning nozzle units 31, 33 and 35 for periods of time different from those mentioned above.

The semiconductor wafer 100 thus cleaned is then transferred from the workpiece support 11 to the hand of the workpiece conveying robot 91 (see FIG. 1). Thereafter, a new semiconductor wafer 100 to be polished is placed onto the workpiece support 11 by the workpiece conveying robot 91.

According to the first embodiment of the present invention in FIGS. 1 through 7A and 7B, inasmuch as the upper and lower surfaces of the semiconductor wafer 100 and the lower surface 76 of the top ring 75 are cleaned substantially simultaneously in one cleaning cycle, they can be cleaned in a short period of time. Therefore, the polishing apparatus can polish semiconductor wafers with increased efficiency for increased productivity.

Figure 8:
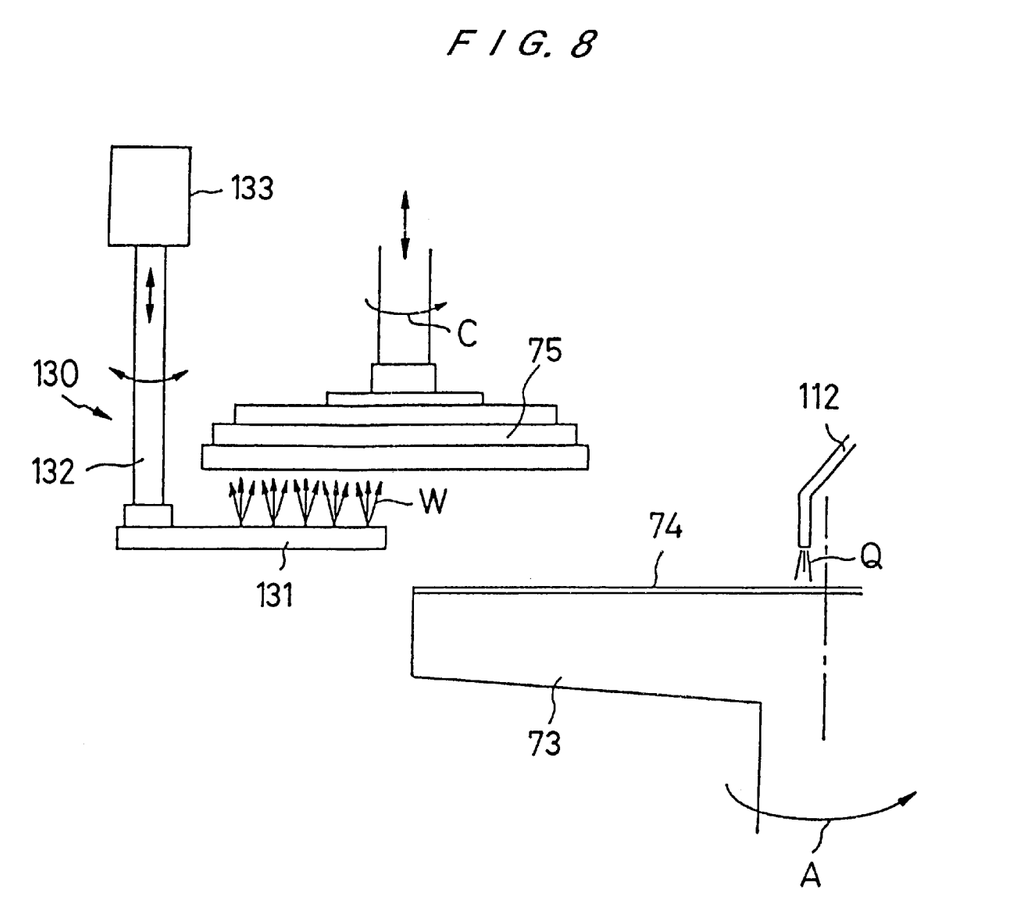
FIG. 8 is a fragmentary front elevational view of a polishing apparatus according to a second embodiment of the present invention.
Figure 9:
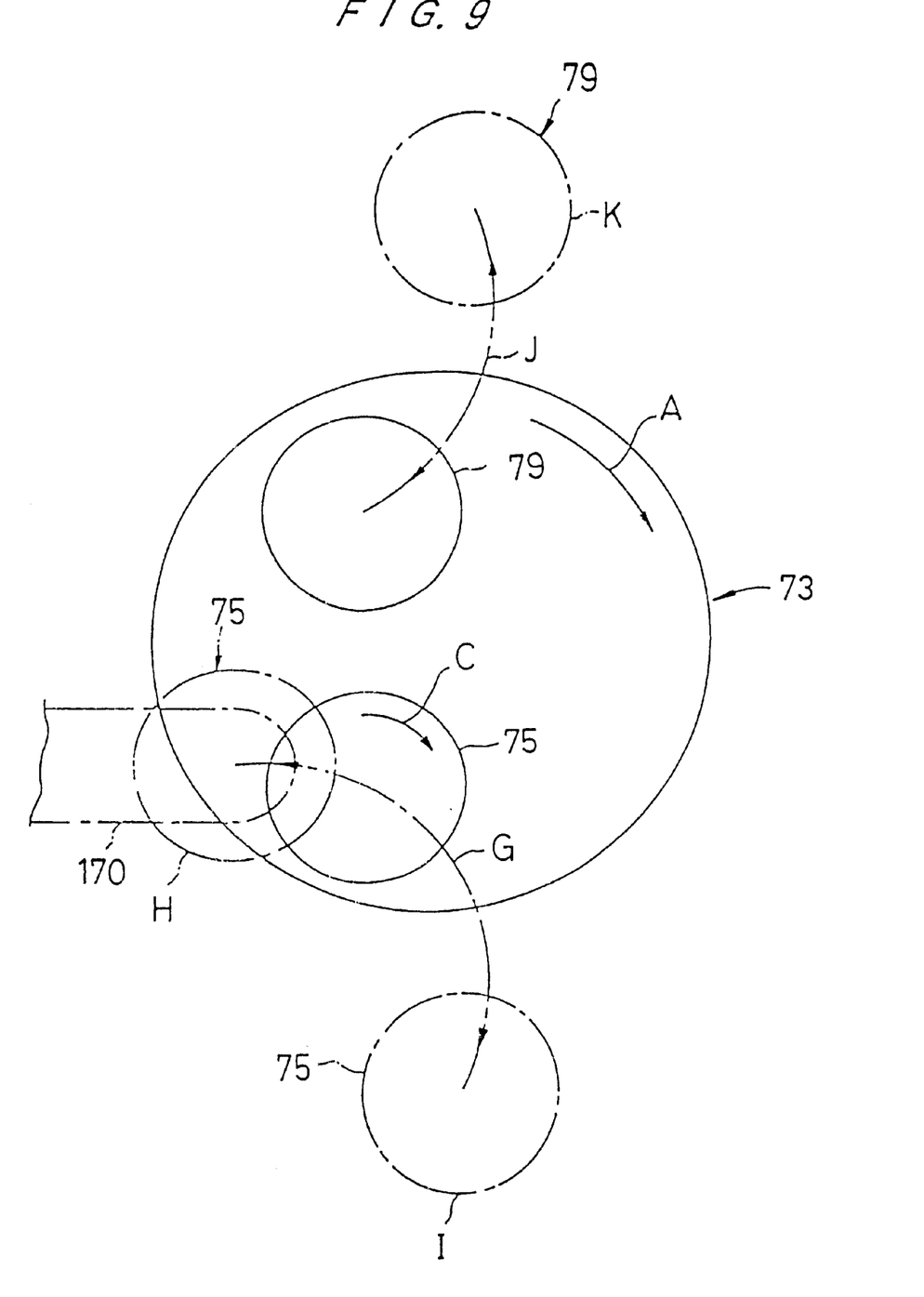
FIG. 9 is a plan view of the polishing apparatus shown in FIG. 8.

Next, a polishing apparatus according to a second embodiment of the present invention will be described with reference to FIGS. 8 and 9. As shown in FIG. 8 and 9, the polishing apparatus has a turntable 73 and a top ring 75 which are rotatable independently of each other in the same direction indicated by the arrows A and C. A polishing cloth 74 is attached to the upper surface of the turntable 73.

After a semiconductor wafer is polished, the top ring 75 is lifted by a lifting/lowering mechanism (not shown), and angularly moved by a swing mechanism to a work transfer position H outside of the turntable 73 in the direction indicated by the arrow G (see FIG. 9). In the workpiece transfer position H, the top ring 75 transfers the polished semiconductor wafer to a hand 170 such a robot hand or the like that extends below the top ring 75. Then, the top ring 75 waits and receives another semiconductor wafer to be polished from the hand 170. The received semiconductor wafer is attached to the lower surface of the top ring 75 under vacuum. The top ring 75 is angularly moved back to a position above the turntable 73 and lowered toward the turntable 73 for polishing the semiconductor wafer. For maintenance, the top ring 75 is angularly moved to a retracted position I.

When the dressing tool 79 is not in operation, the dressing tool 79 is angularly moved to a retracted position K outside of the turntable 73 in the direction indicated by the arrow J.

The polishing apparatus also has a top ring cleaning device 130 for cleaning the lower surface of the top ring 75. The top ring cleaning device 130 has a cleaning liquid nozzle 131 for ejecting a cleaning liquid W mainly of pure water, a vertical shaft 132 supporting the cleaning liquid nozzle 131 on its lower end, and a moving mechanism 133 for vertically moving the shaft 132 and rotating the shaft 132 to angularly move the cleaning liquid nozzle 131. The shaft 132 has a fluid passage defined therein for allowing the cleaning liquid W to pass therethrough. The cleaning liquid W which has passed through the passage in the shaft 132 is ejected upwardly from the cleaning liquid nozzle 131.

A workpiece such as a semiconductor wafer held by the top ring 75 is polished in the same manner as FIG. 2. After the semiconductor wafer is polished, the top ring 75 is elevated by a given distance by the lifting/lowering mechanism and angularly moved to the workpiece transfer position H radially outwardly of the turntable 73, where the polished semiconductor wafer is transferred to the hand 170. At this time, the top ring 75 is positioned as shown in FIG. 8.

Then, the moving mechanism 133 of the top ring cleaning device 130 is actuated to lower the cleaning liquid nozzle 131 to a vertical position between the top ring 75 and the turntable 73, and to rotate the cleaning liquid nozzle 131 about the shaft 132 until the cleaning liquid nozzle 131 faces the lower surface of the top ring 75. Thereafter, the cleaning liquid nozzle 131 ejects the cleaning liquid W to the lower surface of the top ring 75, thereby cleaning the lower surface of the top ring 75.

The cleaning liquid nozzle 131 is positioned below the top ring 75 such that the ejected cleaning liquid W falls outside of the turntable 73, not onto the upper surface of the turntable 73. Since the concentration of the slurry-like abrasive liquid Q, which is supplied from the abrasive liquid nozzle 112 has been adjusted, if the ejected cleaning liquid W fell onto the upper surface of the turntable 73, the concentration of the abrasive liquid Q would vary, or the abrasive liquid Q would undesirably be diluted.

Figure 10:
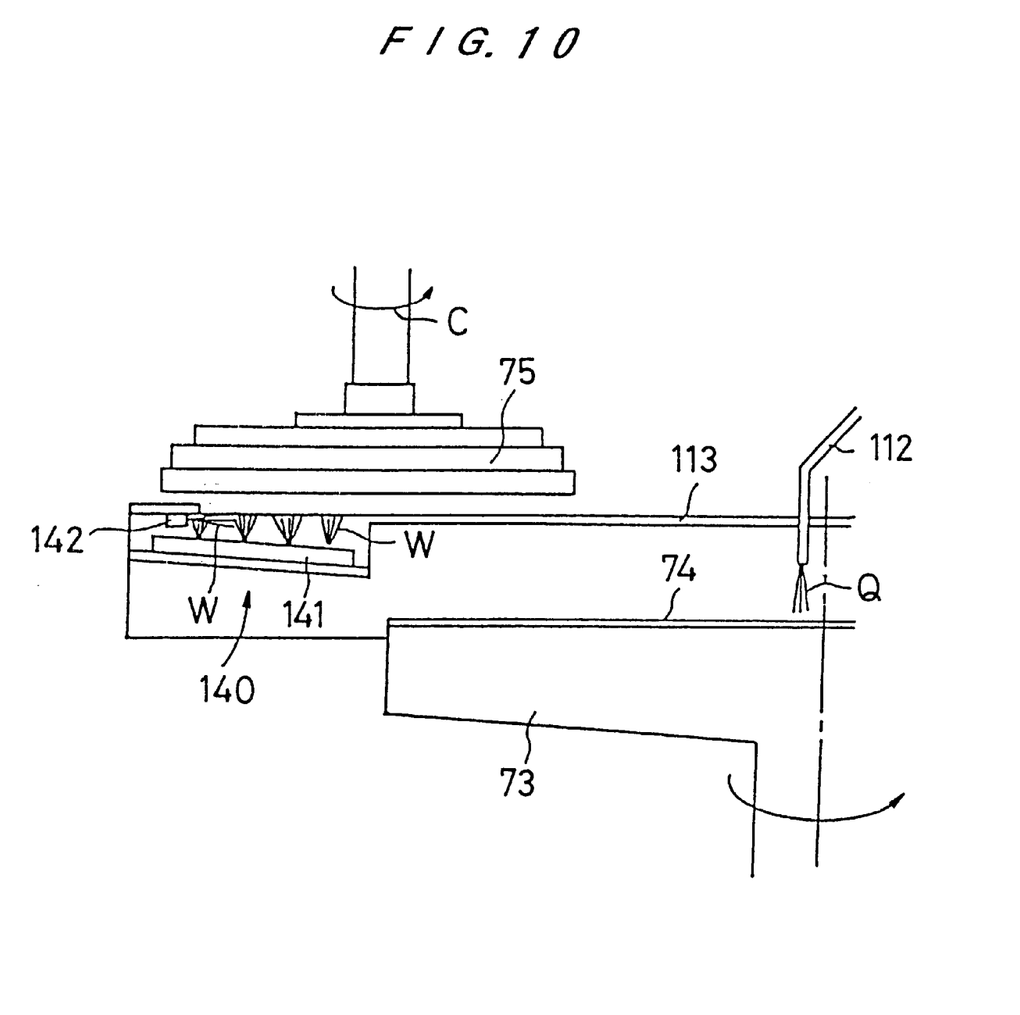
FIG. 10 is a fragmentary front elevational view of a polishing apparatus according to a third embodiment of the present invention.

FIG. 10 shows a polishing apparatus according to a third embodiment of the present invention. The polishing apparatus shown in FIG. 10 includes a turntable 73 and a top ring 75 which are identical to those shown in FIG. 8. The polishing apparatus shown in FIG. 10 also has a top ring cleaning device 140 having cleaning liquid nozzles 141 and 142 for ejecting a cleaning liquid W. The top ring cleaning device 140 is mounted on a table cover 113 which is disposed above the turntable 73 and covers a predetermined range of the turntable 73. The top ring cleaning device 140 is positioned near a location where the top ring 75 transfers a polished semiconductor wafer to, hand 170 and receives a semiconductor wafer to be polished from the hand 170.

Figure 11:
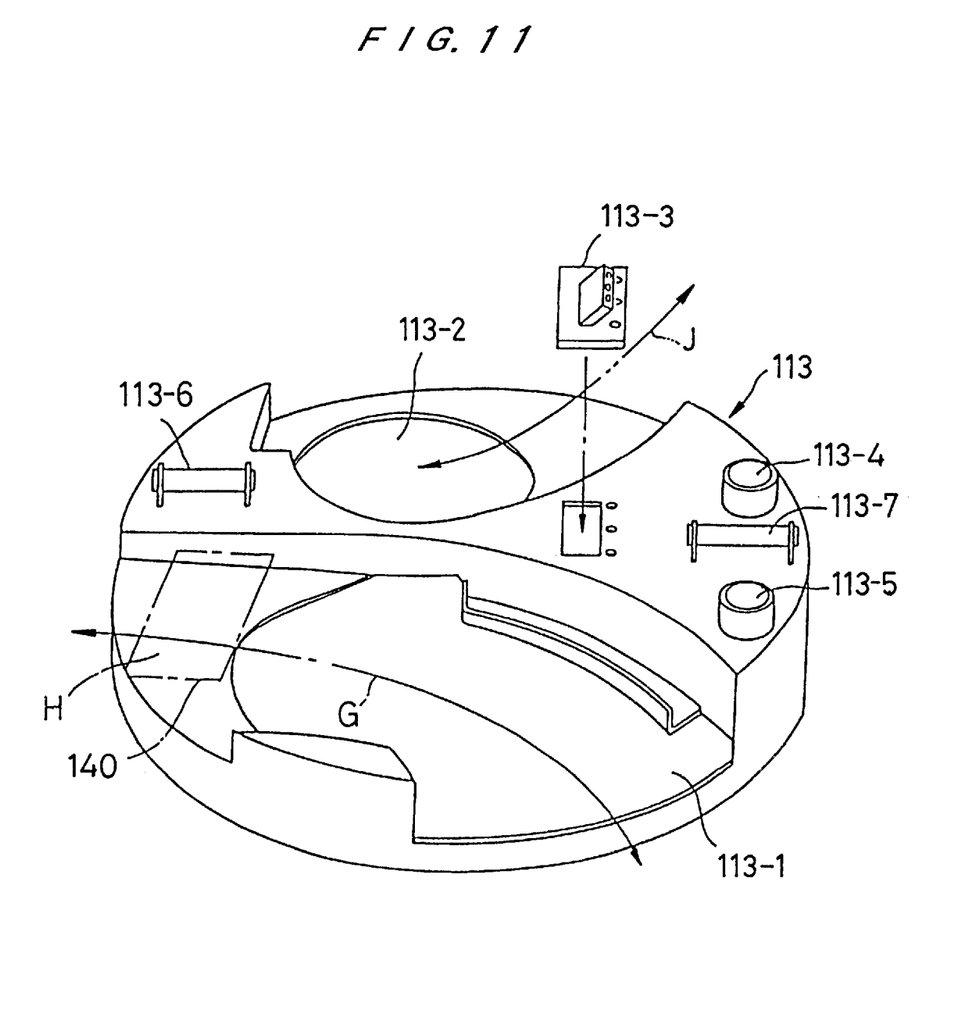
FIG. 11 is a perspective view of a table cover of the polishing apparatus shown in FIG. 10.

FIG. 11 shows the table cover 113 in detail. As shown in FIGS. 10 and 11, the table cover 113 is in the form of dome disposed over the turntable for preventing the abrasive liquid from being scattered around. The table cover 113 has an arcuate recess defined in its upper surface for allowing the top ring 75 to move therein in the direction indicated by the arrow G between the workpiece wafer transfer position H and retracted position I, and a top ring insertion hole 113-1 defined in the arcuate recess for allowing the top ring 75 to move therein downwardly toward and upwardly away from the upper surface of the turntable 73. The table cover 113 also has a recess defined in its upper surface for allowing a dressing tool (corresponding to the dressing tool 79 in FIG. 2) to move in the direction indicated by the arrow J, and a dressing tool insertion hole 113-2 defined in the recess for allowing the dressing tool to move therein downwardly toward and upwardly away from the upper surface of the turntable 73.

The top ring cleaning device 140 is positioned at the workpiece transfer position H over the table cover 113. After a polished semiconductor wafer is transferred from the top ring 75 in the workpiece transfer position H to the hand 170, the top ring cleaning device 140 ejects a cleaning liquid to the lower surface of the top ring 75 to clean the same.

As shown in FIGS. 10 and 11, the table cover 1113 supports a nozzle unit 113-3 which comprises an abrasive liquid nozzle 112 for supplying an abrasive liquid and a rinsing liquid nozzle for supplying a rinsing liquid. The table cover 113 has exhaust holes 113-4 and 113-5 defined therein for discharging gases inside the table cover 113, and handles 113-6 and 113-7 that can be manually gripped by an operator to move the table cover 113 with respect to the turntable 73.

Figure 12:
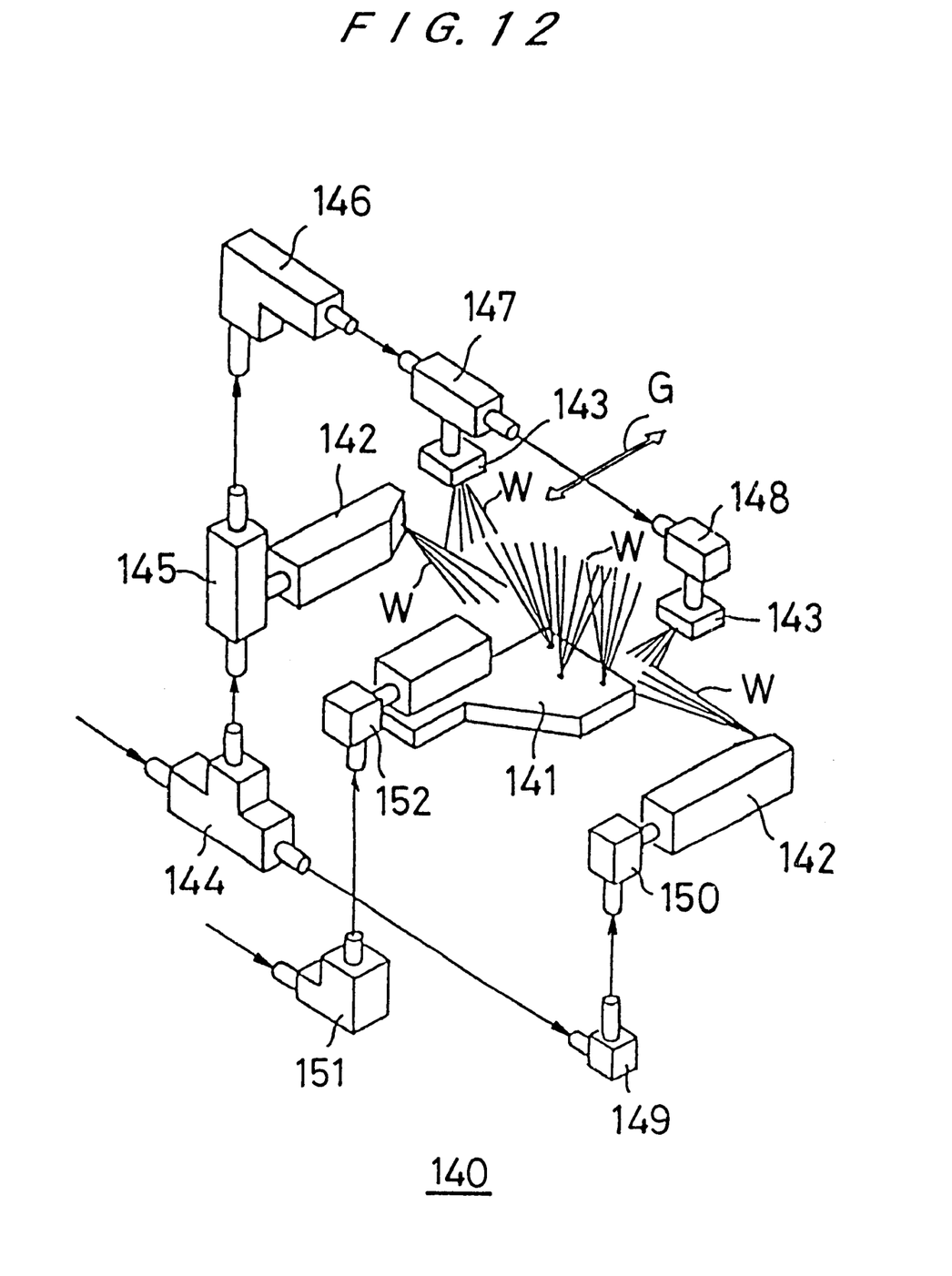
FIG. 12 is a perspective view of a system of nozzles, nozzle joints, and pipes of a top ring cleaning device of the polishing apparatus shown in FIG. 10.

FIG. 12 shows a system of nozzles, nozzle joints, and pipes of the top ring cleaning device 140 of the polishing apparatus shown in FIG. 10.

As shown in FIG. 12, the top ring cleaning device 140 comprises cleaning liquid nozzle 141 for ejecting a cleaning liquid W to the lower surface of the top ring 75, a pair of cleaning liquid nozzles 142 disposed one on each side of the cleaning liquid nozzle 141 for ejecting confronting sprays of the cleaning liquid W, and a pair of cleaning liquid nozzles 143 disposed one on each side of the cleaning liquid nozzle 141 for ejecting downward sprays of the cleaning liquid W. The cleaning liquid nozzle 141 is connected through nozzle joints 151, 152 to a pipe coupled to a cleaning liquid source, and the cleaning liquid nozzles 142, 143 are connected through nozzle joints 144 through 150 to pipes coupled to the cleaning liquid source.

Figure 13:
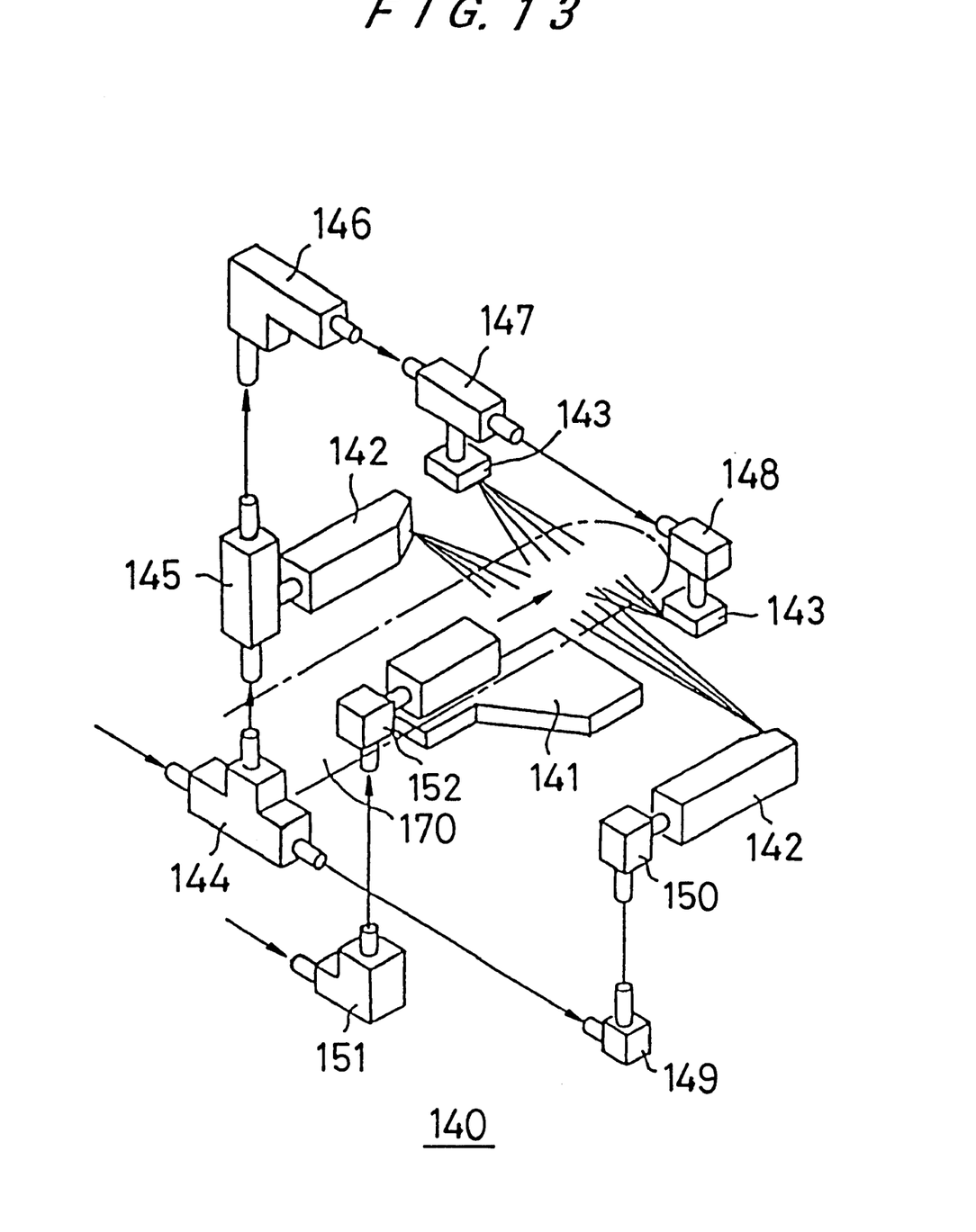
FIG. 13 is a perspective view of the system shown in FIG. 12, illustrating the manner in which a hand is cleaned by the top ring cleaning device.

FIG. 13 shows the system shown in FIG. 12, illustrating the manner in which the hand 170 is cleaned by the top ring cleaning device 140.

As shown in FIG. 13, the cleaning liquid nozzles 142 and the cleaning liquid nozzles 143 eject sprays of the cleaning liquid W to upper and side surfaces of the hand 170 to clean them. Then, as shown in FIG. 9, the top ring 75 holding a polished semiconductor wafer attached to the lower surface thereof is angularly moved to the workpiece transfer position H, and transfers the polished semiconductor wafer to the hand 170 in the workpiece transfer position H. At this time, the cleaning liquid nozzles 142 and the cleaning liquid nozzles 143 continuously eject sprays of the cleaning liquid W to the semiconductor wafer to clean the both sides, i.e., the upper and the polished lower surfaces thereof.

Figure 14:
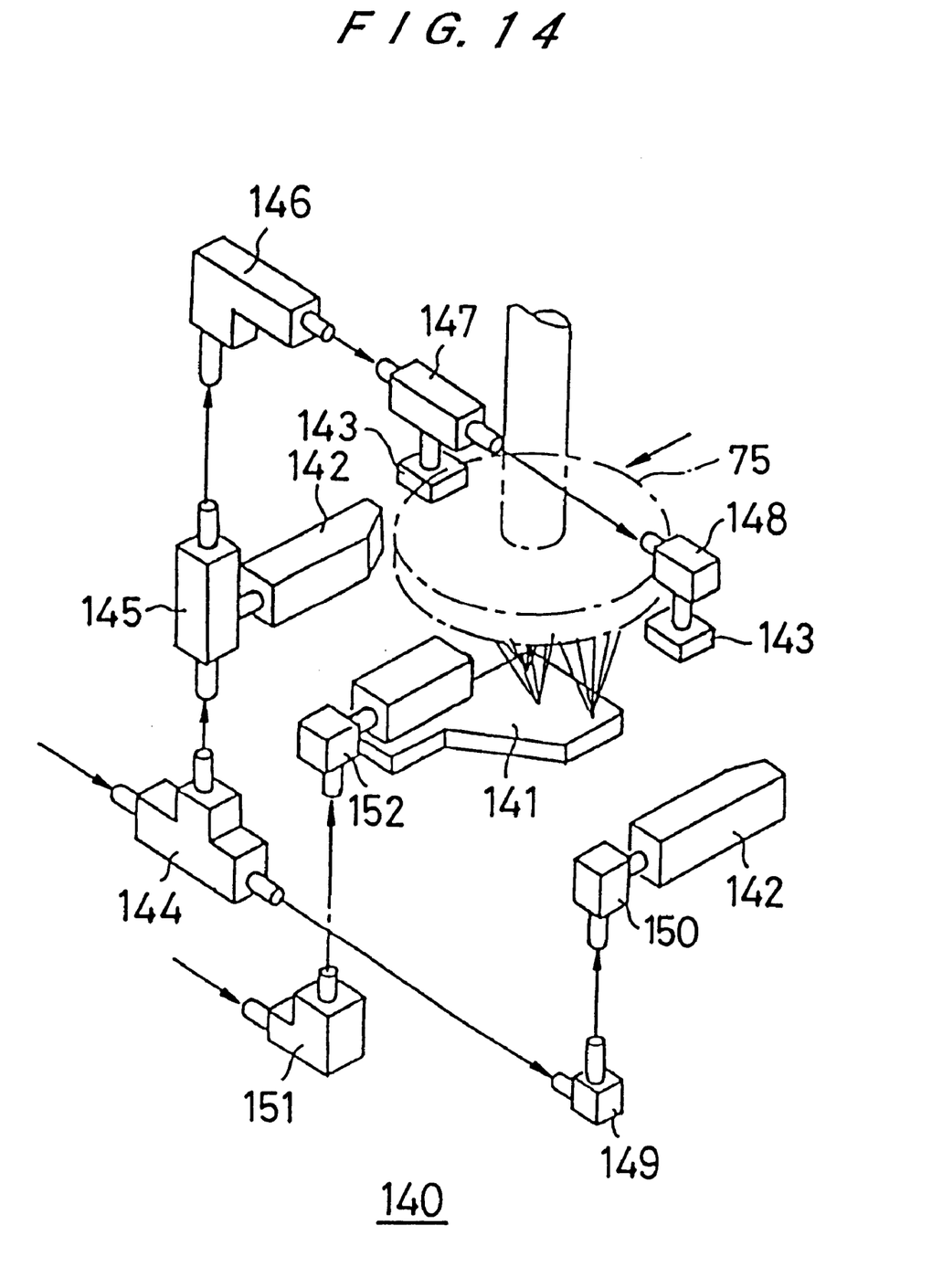
FIG. 14 is a perspective view of the system shown in FIG. 12, illustrating the manner in which the lower surface of a top ring is cleaned by the top ring cleaning device.

After the hand 170 which has received the polished semiconductor wafer is retracted, the cleaning liquid nozzle 141 ejects a spray of cleaning liquid W to clean the lower surface (holding surface) of the top ring 75 which has held the semiconductor wafer, as shown in FIG. 14. Then, the top ring 75 receives a new semiconductor wafer to be polished from the hand 170 and holds the received semiconductor wafer on the lower surface thereof under vacuum. The top ring 75 which has held the semiconductor wafer is moved back to the position over the turntable 73 and lowered to press the semiconductor wafer against the polishing cloth 74 on the turntable 73 for thereby polishing the semiconductor wafer.

While the top ring 75 is in the workpiece transfer position H, the cleaning liquid nozzles 142, 143 eject sprays of the cleaning liquid W to upper and side surfaces of the top ring 75 to prevent the top ring 75 from being dried.

In this embodiment, the cleaning liquid nozzle 141 applies the cleaning liquid W to the lower surface of the top ring 75 which is in the workpiece transfer position H after the top ring 75 has transferred the polished semiconductor wafer to the hand 170. However, the cleaning liquid nozzle 141 may apply the cleaning liquid W to the lower surface of the top ring 75 which is still holding the polished semiconductor wafer immediately after the polishing process is finished, for thereby cleaning the polished surface of the semiconductor wafer to remove particles from the semiconductor wafer. That is, since the polished surface of the semiconductor wafer can be cleaned immediately after polishing, the cleaning effect of the semiconductor wafer is higher than that of the case in which the polished surface of the semiconductor wafer is cleaned after the top ring 75 transfers the semiconductor wafer to the hand 170 at the workpiece transfer position H. This is because the timing of cleaning in this case is earlier than that in the previous case. The cleaning liquid nozzle 141 may be positioned such that it can apply the cleaning liquid W before the top ring 75 reaches the workpiece transfer position H.

The system of the cleaning liquid nozzles 141, 142 and 143, the nozzle joints 144 through 152, and the pipes is illustrated by way of example in FIG. 12, and may be modified in various ways.

The top ring 75 is cleaned each time a semiconductor wafer is polished. The top ring 75 is also cleaned while the polishing apparatus is waiting for one lot of semiconductor wafers or is in normal shutdown, so that the top ring 75 is prevented from being undesirably dried.

A dressing tool cleaning device which is identical or similar to the top ring cleaning devices 130, 140 may be provided for cleaning the dressing tool 79. Either one or both of the top ring cleaning device and the dressing tool cleaning device may be employed.

According to the second and third embodiments of the present invention in FIGS. 8 through 14, since the top ring and/or the dressing tool is in a position outside of the turntable or over the table cover, the top ring and/or the dressing tool can be cleaned without altering the composition of the abrasive liquid on the turntable. Inasmuch as the top ring is cleaned in the workpiece transfer position at the time of transferring a semiconductor wafer, it is not necessary to clean the top ring in a dedicated cleaning station. In the absence of such a dedicated cleaning station, the space required by the polishing apparatus is minimized, and the overall processing time required for the polishing apparatus to polish semiconductor wafers is not affected by the cleaning of the top ring.

When the top ring is in the workpiece transfer position, the cleaning liquid nozzle of the top ring cleaning device is positioned below the top ring and ejects the cleaning liquid to the lower surface of the top ring for thereby cleaning the top ring. The top ring cleaning device is of a relatively simple structure for effectively cleaning the lower surface of the top ring. While the top ring is still holding the semiconductor wafer immediately after the semiconductor wafer is polished, the cleaning liquid nozzle ejects the cleaning liquid to the polished semiconductor wafer to effectively remove particles attached to the semiconductor wafer.

The hand for carrying a semiconductor wafer is also cleaned by the cleaning liquid ejected by the top ring cleaning device. Therefore, particles applied from the hand to the semiconductor wafer are minimized.

Although certain preferred embodiments of the present invention have been shown and described in detail, it should be understood that various changes and modifications may be made thereto without departing from the scope of the appended claims.

What is claimed is:

1. A polishing apparatus for polishing a surface of a workpiece, said apparatus comprising:

a turntable having thereon a polishing surface;

a top ring for holding a workpiece to be polished and for pressing the workpiece against said polishing surface on said turntable;

a pusher for transferring the workpiece between said top ring and said pusher, said pusher having a workpiece support vertically movable between a transfer position close to said top ring, where transfer of the workpiece occurs, and a withdrawn position, where the workpiece transferred to said support is spaced from and confronts said top ring;

a first cleaning device for ejecting a cleaning liquid toward the workpiece, on said pusher, which has been polished and removed from said top ring, said first cleaning device being operable to clean both surfaces of said workpiece simultaneously;

a second cleaning device for cleaning said workpiece which has been polished and cleaned by said first cleaning device; and a transfer device for transferring the cleaned workpiece from the second cleaning device to a wafer cassette.

2. An apparatus as claimed in claim 1, wherein said first cleaning device cleans both said workpiece and said top ring.

3. An apparatus as claimed in claim 1, further comprising a drier for drying said workpiece after said workpiece is cleaned by said second cleaning device.

4. A polishing apparatus capable of having a lot of semiconductor wafers loaded therein, said polishing apparatus operable to polish a surface of a semiconductor wafer, said polishing apparatus comprising:

a turntable having thereon a polishing surface;

a top ring operable to hold a semiconductor wafer to be polished and operable to press the semiconductor wafer against said polishing surface on said turntable; and a cleaning device operable to clean said top ring while the polishing apparatus is waiting for a lot of the semiconductor wafers to be loaded therein.

5. A polishing apparatus for polishing a surface of a semiconductor wafer, said polishing apparatus comprising:

a turntable having thereon a polishing surface;

a top ring operable to hold a semiconductor wafer to be polished and operable to press the semiconductor wafer against said polishing surface on said turntable; and a cleaning device operable to clean said top ring while the polishing apparatus is in a process of a normal shutdown operation.

6. A polishing apparatus for polishing a surface of a workpiece, said polishing apparatus comprising:

a turntable having thereon a polishing surface;

a top ring operable to hold a workpiece to be polished and operable to press the workpiece against said polishing surface on said turntable;

a pusher operable to transfer the workpiece between said top ring and said pusher, said pusher having a workpiece support vertically movable between a transfer position close to said top ring, where transfer of the workpiece occurs, and a withdrawn position, where the workpiece transferred to said support is spaced from and confronts said top ring;

a first cleaning device operable to eject a cleaning liquid toward the workpiece, on said pusher, after said top ring has pressed the semiconductor wafer against said polishing surface on said turntable, said first cleaning device being operable to clean said workpiece and a lower surface of said top ring, and said first cleaning device including a nozzle located near said pusher, said nozzle operable to clean said lower surface of said top ring;

a second cleaning device operable to clean said workpiece after said first cleaning device has cleaned said workpiece; and a transfer device operable to transfer the workpiece from the second cleaning device to a wafer cassette after said second cleaning device has cleaned the workpiece.

\* \* \* \* \*